(12) United States Patent
Webb

(10) Patent No.: US 8,492,901 B2
(45) Date of Patent: Jul. 23, 2013

(54) METAL OXIDE SEMICONDUCTOR (MOS)-COMPATIBLE HIGH-ASPECT RATIO THROUGH-WAFER VIAS AND LOW-STRESS CONFIGURATION THEREOF

(75) Inventor: Bucknell C. Webb, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 895 days.

(21) Appl. No.: 12/614,062

(22) Filed: Nov. 6, 2009

(65) Prior Publication Data
US 2011/0108958 A1   May 12, 2011

(51) Int. Cl.
*H01L 23/538* (2006.01)
(52) U.S. Cl.
USPC .......................................................... 257/774
(58) Field of Classification Search
USPC .......... 438/667, 627, 629; 257/621, 774–775, 257/784
See application file for complete search history.

(56) References Cited

U.S. PATENT DOCUMENTS

| | | | |
|---|---|---|---|
| 6,667,549 B2 | 12/2003 | Cahill | |
| 6,716,657 B1 * | 4/2004 | Soh | 438/29 |
| 6,960,490 B2 | 11/2005 | Cunningham | |
| 7,488,680 B2 | 2/2009 | Andry et al. | |
| 7,785,987 B2 * | 8/2010 | Trezza | 438/456 |
| 7,964,972 B2 * | 6/2011 | Matsui | 257/774 |
| 8,034,713 B2 * | 10/2011 | Dunne | 438/667 |
| 8,039,314 B2 * | 10/2011 | DeGraw et al. | 438/113 |
| 8,039,393 B2 * | 10/2011 | Wang et al. | 438/667 |
| 8,076,739 B2 * | 12/2011 | Schmollngruber et al. | 257/419 |
| 2005/0121768 A1 | 6/2005 | Edelstein et al. | |
| 2006/0042952 A1 | 3/2006 | Oliver et al. | |
| 2007/0020926 A1 * | 1/2007 | Kalvesten et al. | 438/667 |
| 2007/0120241 A1 * | 5/2007 | Trezza et al. | 257/686 |
| 2007/0132105 A1 | 6/2007 | Akram et al. | |
| 2007/0257373 A1 | 11/2007 | Akram et al. | |
| 2008/0001269 A1 * | 1/2008 | Hsu et al. | 257/678 |
| 2008/0157287 A1 | 7/2008 | Choi et al. | |
| 2008/0274583 A1 | 11/2008 | Andry et al. | |
| 2010/0052108 A1 * | 3/2010 | Barth et al. | 257/621 |

OTHER PUBLICATIONS

Stress concentration, Wikipedia, http://en.wikipedia.org/wiki/Stress_concentration, pp. 1-3.
Rowbotham, Backside Thinning and Processing for Through-Silicon via (TSV) Technology, 2006, vol. 45/06 of Masters Abstracts, of Dissertations Abstracts International, Abstract.
U.S. Appl. No. 12/352,718, Andry et al., High Yield Method of Exposing and Contacting Through-Silicon Vias, filed Jan. 13, 2009.

* cited by examiner

*Primary Examiner* — Nathan Ha
(74) *Attorney, Agent, or Firm* — Daniel P. Morris; Ryan, Mason & Lewis, LLP

(57) ABSTRACT

A structure includes a wafer having a top wafer surface. The wafer defines an opening. The top wafer surface defines a first reference direction perpendicular to the top wafer surface. The wafer has a thickness in the first reference direction. The structure also includes a through-wafer via formed in the opening. The through-wafer via has a shape, when viewed in a plane perpendicular to the first reference direction and parallel to the top wafer surface, of at least one of a spiral and a C-shape. The through-wafer via has a height in the first reference direction essentially equal to the thickness of the wafer in the first reference direction. Manufacturing techniques are also disclosed.

26 Claims, 18 Drawing Sheets

FIG. 1A
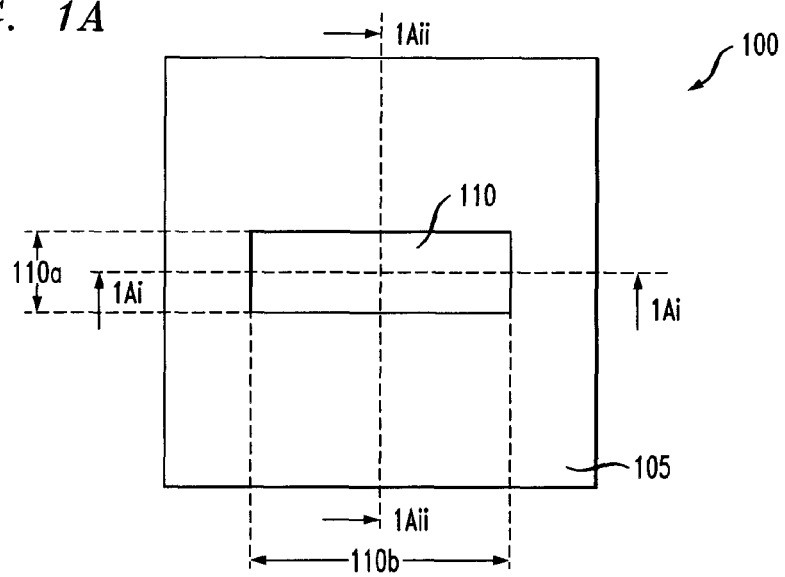
FIG. 1Ai
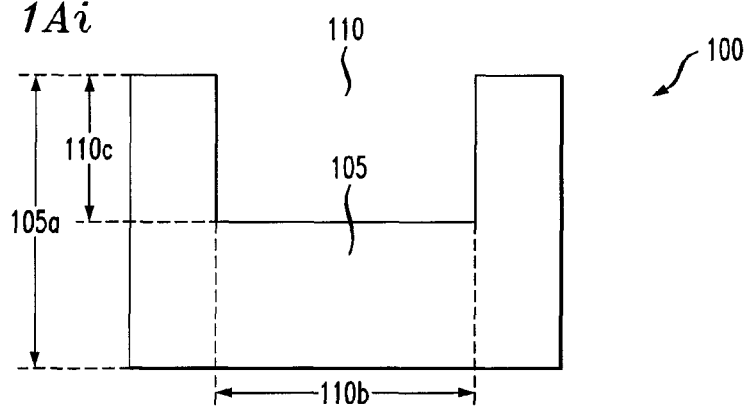
FIG. 1Aii
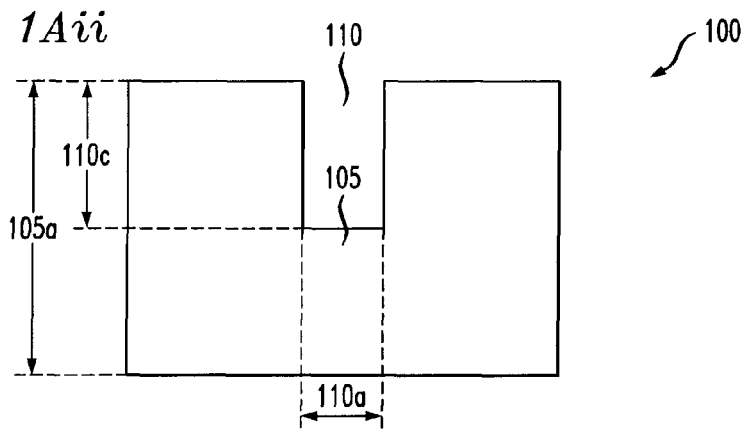

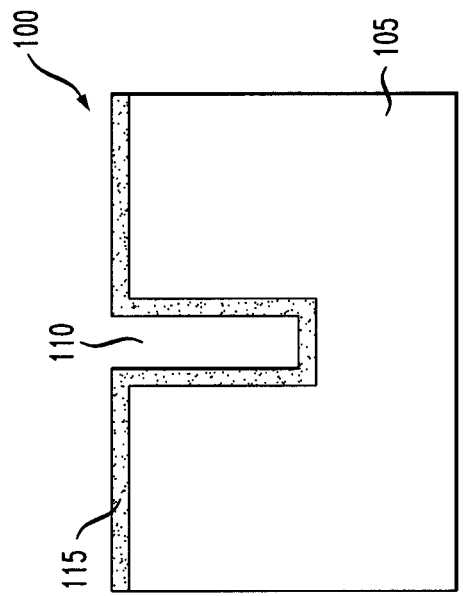
FIG. 1Bii
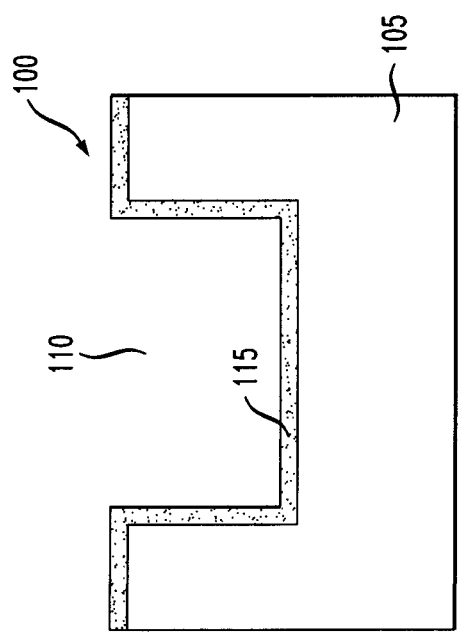
FIG. 1Bi

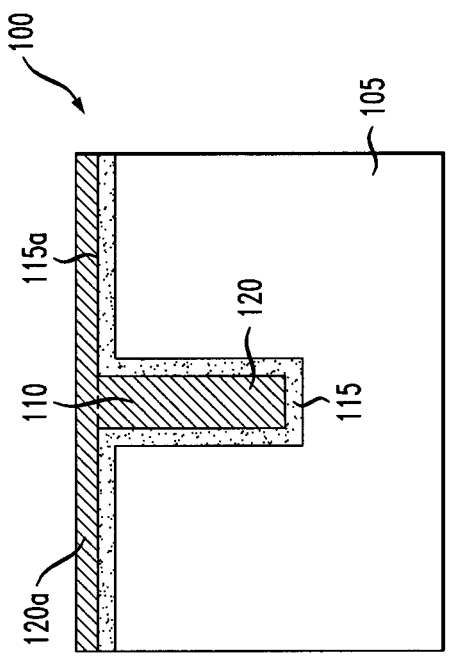
FIG. 1Cii
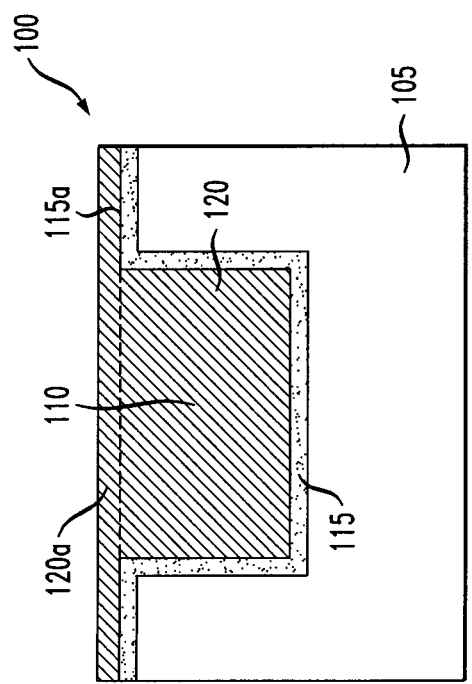
FIG. 1Ci

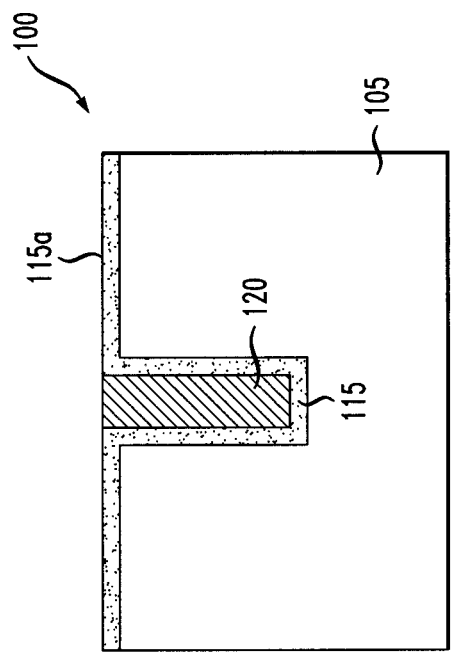
FIG. 1Dii
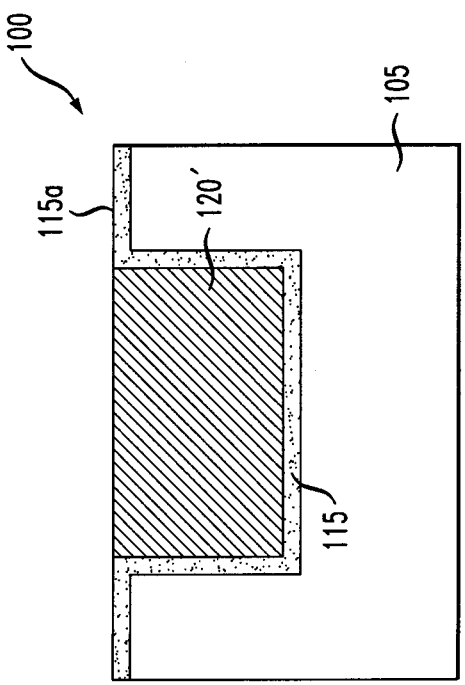
FIG. 1Di

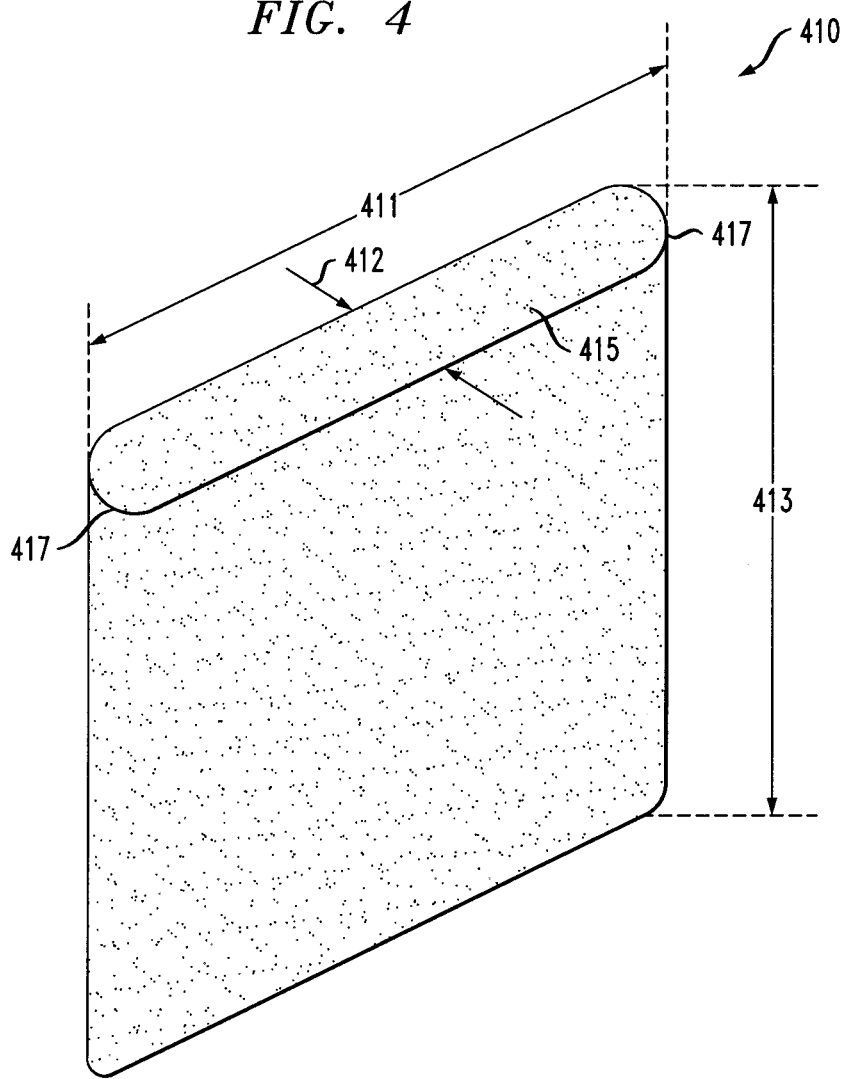

FIG. 12
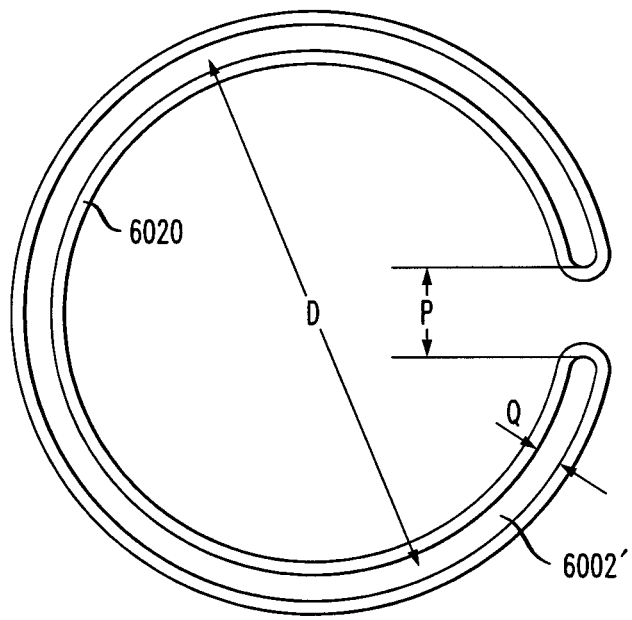
FIG. 13
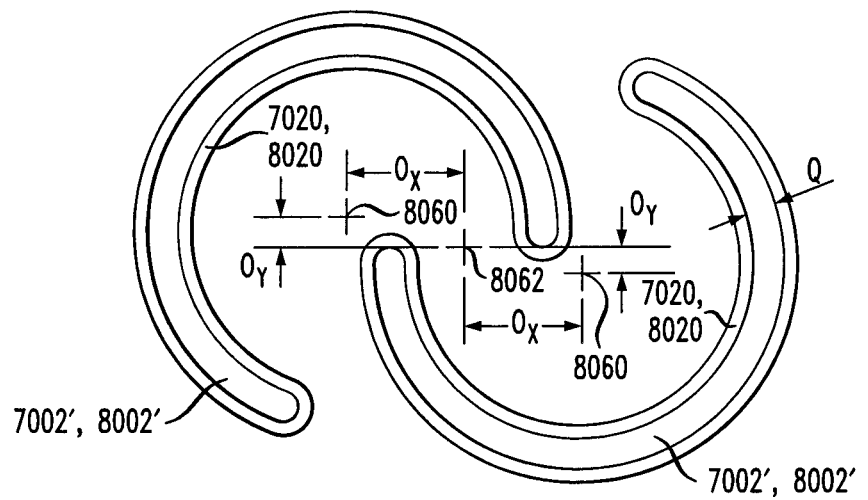
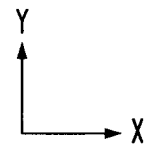

METAL OXIDE SEMICONDUCTOR (MOS)-COMPATIBLE HIGH-ASPECT RATIO THROUGH-WAFER VIAS AND LOW-STRESS CONFIGURATION THEREOF

FIELD OF THE INVENTION

The present invention relates to the electrical, electronic and computer arts, and, more particularly, to through-wafer vias, and the like.

BACKGROUND OF THE INVENTION

Through-wafer vias electrically connect from a top surface of a semiconductor wafer to a bottom surface of the semiconductor wafer (hence the name through-wafer vias). If through-wafer vias have high-aspect ratios (i.e., the heights of the through-wafer vias are much greater than their widths), the through-wafer vias are very difficult to form.

SUMMARY OF THE INVENTION

Principles of the invention provide techniques for metal oxide semiconductor (MOS)-compatible high-aspect ratio through-wafer vias and low-stress configurations thereof.

In one aspect, an exemplary embodiment of a structure includes a wafer having a top wafer surface. The wafer defines an opening. The top wafer surface defines a first reference direction perpendicular to the top wafer surface. The wafer has a thickness in the first reference direction. The structure also includes a through-wafer via formed in the opening. The through-wafer via has a shape, when viewed in a plane perpendicular to the first reference direction and parallel to the top wafer surface, of at least one of a spiral and a C-shape. The through-wafer via has a height in the first reference direction essentially equal to the thickness of the wafer in the first reference direction.

In another aspect, a method includes the step of providing a wafer having a top wafer surface. The top wafer surface defines a first reference direction perpendicular to the top wafer surface. The wafer has a thickness in the first reference direction. Another step includes forming a through-wafer via trench in the wafer. The through-wafer via trench has a shape, when viewed in a plane perpendicular to the first reference direction and parallel to the top wafer surface, of at least one of a spiral and a C-shape. The through-wafer via trench has a height in the first reference direction less than the thickness of the wafer in the first reference direction.

As used herein, "facilitating" an action includes performing the action, making the action easier, helping to carry the action out, or causing the action to be performed.

These and other features, aspects and advantages of the invention will become apparent from the following detailed description of illustrative embodiments thereof, which is to be read in connection with the accompanying drawings.

BRIEF DESCRIPTION OF THE DRAWINGS

FIGS. 1A-1G show top down views and cross-section views of a semiconductor structure going through different steps of a via fabrication process;

FIG. 2A' shows a perspective view of the through-wafer via structure of FIG. 2A;

FIG. 4 shows a perspective view of an exemplary via;

FIG. 12 shows the via of FIG. 6 filled with metal and with stress contours omitted;

FIG. 13 shows a via generally similar to those of FIGS. 7 and 8 filled with metal and with stress contours omitted;

DETAILED DESCRIPTION OF PREFERRED EMBODIMENTS

Figure 1E:
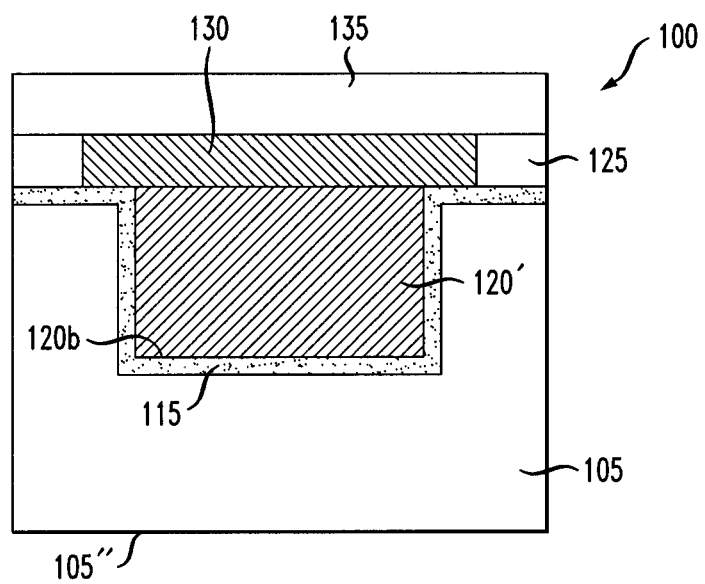

Initially, the complete disclosure of co-assigned U.S. Patent Publication 2008-0274583 of Andry et al., entitled "Through-Wafer Vias," published on Nov. 6, 2008, is expressly incorporated herein by reference in its entirety for all purposes.

FIGS. 1A-1G show top down views and cross-section views of a semiconductor structure 100 going through different steps of a via fabrication process.

More specifically, with reference to FIG. 1A (top down view), the via fabrication process starts with a semiconductor structure 100 which comprises a silicon wafer 105 and a through-wafer via trench 110 in the silicon wafer 105. The through-wafer via trench 110 can be formed by lithographic and etching processes.

In one embodiment, the length 110b of the through-wafer via trench 110 is much larger (e.g., at least ten times greater) than the width 110a of the through-wafer via trench 110. For example, the width 110a can be 4 μm, whereas the length 110b can be at least 40 μm. Other embodiments could have different dimensions.

FIG. 1Ai shows a cross section view of the semiconductor structure 100 of FIG. 1A along a first line 1Ai-1Ai. In some instances, the depth 110c of the through-wafer via trench 110 is about 180 μm or about one fourth the thickness 105a of the silicon wafer 105.

FIG. 1Aii shows a cross section view of the semiconductor structure 100 of FIG. 1A along a second line 1Aii-1Aii. In some instances, the depth 110c of the through-wafer via trench 110 is at least ten times the width 110a of the through-wafer via trench 110.

Next, with reference to FIG. 1Bi, in some instances, a dielectric layer 115 is formed on exposed surfaces of the semiconductor structure 100 of FIG. 1Ai. The dielectric layer 115 can comprise, for example, silicon dioxide. In some instances, the dielectric layer 115 can be formed by CVD (Chemical Vapor Deposition) of silicon dioxide on top of the exposed surfaces of the semiconductor structure 100 of FIG. 1Ai. Alternatively, the dielectric layer 115 can be formed by thermally oxidizing the exposed surfaces of the semiconductor structure 100 of FIG. 1Ai.

FIG. 1Bii shows the semiconductor structure 100 resulting from the formation of the dielectric layer 115 on the exposed surfaces of the semiconductor structure 100 of FIG. 1Aii.

Next, with reference to FIG. 1Ci, in some instances, a through-wafer via layer 120 is formed on top of the semiconductor structure 100 of FIG. 1Bi (including in the through-wafer via trench 110). The through-wafer via layer 120 can comprise, for example, tungsten. The through-wafer via layer 120 can be formed by CVD of tungsten on top of the semiconductor structure 100 of FIG. 1Bi (including in the through-wafer via trench 110).

FIG. 1Cii shows the semiconductor structure 100 resulting from the formation of the through-wafer via layer 120 on top of the semiconductor structure 100 of FIG. 1Bii (including in the through-wafer via trench 110).

Next, with reference to FIG. 1Ci, in one embodiment, a top portion 120a of the through-wafer via layer 120 outside the through-wafer via trench 110 is removed such that a top surface 115a of the dielectric layer 115 is exposed to the surrounding ambient as shown in FIG. 1Di. What remains of the through-wafer via layer 120 after the removal can be referred to as a through-wafer via 120' (FIG. 1Di). The top portion 120a of the through-wafer via layer 120 outside the through-wafer via trench 110 can be removed by chemical mechanical polishing (CMP).

FIG. 1Dii shows the semiconductor structure 100 resulting from the removal of the top portion 120a of the through-wafer via layer 120 of FIG. 1Cii.

Next, with reference to FIG. 1E, in one embodiment, additional conventional steps are performed on the semiconductor structure 100 of FIG. 1Di resulting in the semiconductor structure 100 of FIG. 1E.

In some instances, the semiconductor structure 100 in FIG. 1E comprises the silicon wafer 105, the dielectric layer 115, the through-wafer via 120', an insulating layer 125, a top pad structure 130, and a glass handler 135. The handler 135 can also be made, for example, of silicon.

More specifically, the top pad structure 130 can comprise, for example, Cu, whereas the dielectric layer 115 can comprise, for example, silicon dioxide. The glass handler 135 is attached to the insulating layer 125 and the top pad structure 130 by, for example, an adhesive layer (not shown).

Figure 1F:
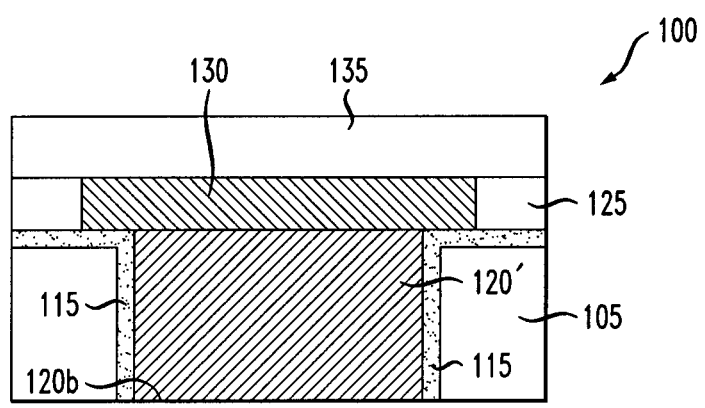

Next, in some instances, a bottom surface 105" of the silicon wafer 105 is mechanically ground until a bottom surface 120b of the through-wafer via 120' is exposed to the surrounding ambient, resulting in the semiconductor structure 100 of FIG. 1F.

Figure 1G:
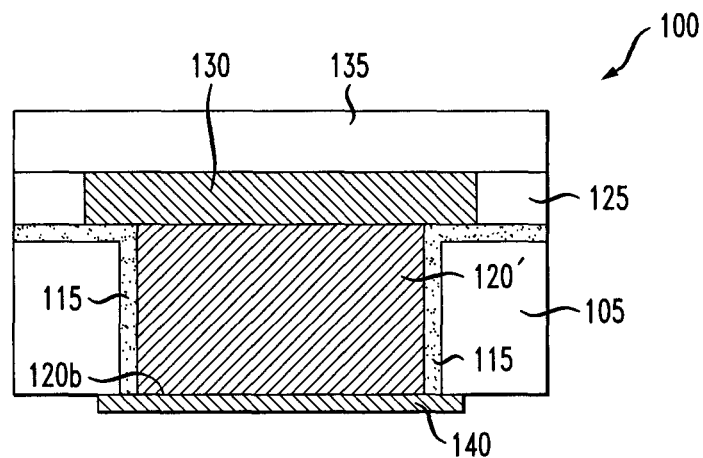

Next, with reference to FIG. 1G, a bottom pad structure 140 is formed on the bottom surface 120b of the through-wafer via 120'. More specifically, the bottom pad structure 140 can comprise, for example, Cu. The bottom pad structure 140 can be formed, for example, by using lithography and etching processes. As seen in FIG. 1G, the through-wafer via 120' provides an electrical path through the thickness 105b of the wafer 105.

Figure 2A:
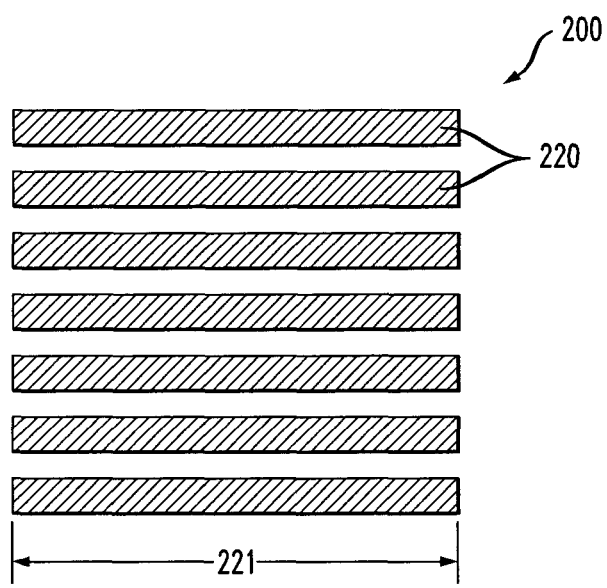
FIG. 2A shows a top down view of a through-wafer via structure.
Figure 2A:
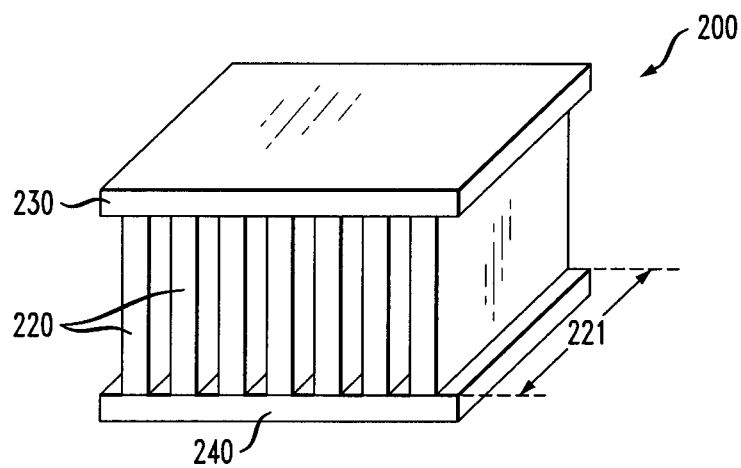

FIG. 2A shows a top down view of an exemplary through-wafer via structure 200 formed in a wafer (not shown). More specifically, the through-wafer via structure 200 can comprise multiple through-wafer vias 220 (seven are shown for illustration) each of which is similar to the through-wafer via 120' of FIG. 1G, to form the composite through-wafer via structure 200.

Each of the multiple through-wafer vias 220 of the composite through-wafer via structure 200 can be formed in a manner similar to the manner in which the through-wafer via 120' (of FIG. 1G) is formed. In at least some instances, the multiple through-wafer vias 220 are formed simultaneously.

It should be noted that each of the multiple through-wafer vias 220 comprises other layers (not shown) similar to the silicon wafer 105, the dielectric layer 115, the insulating layer 125, and the glass handler 135 of FIG. 1G. However, these layers are not shown in FIG. 2A for simplicity. In some instances, the multiple through-wafer vias 220 have the same length 221.

FIG. 2A' shows a perspective view of the composite through-wafer via structure 200 of FIG. 2A. It should be noted that the top pad structure 230 and the bottom pad structure 240 are respectively similar to the top pad structure 130 and the bottom pad structure 140 of FIG. 1G. More specifically, in the example depicted, all the multiple through-wafer vias 220 are electrically coupled to the top pad structure 230 and the bottom pad structure 240.

Figure 2B:
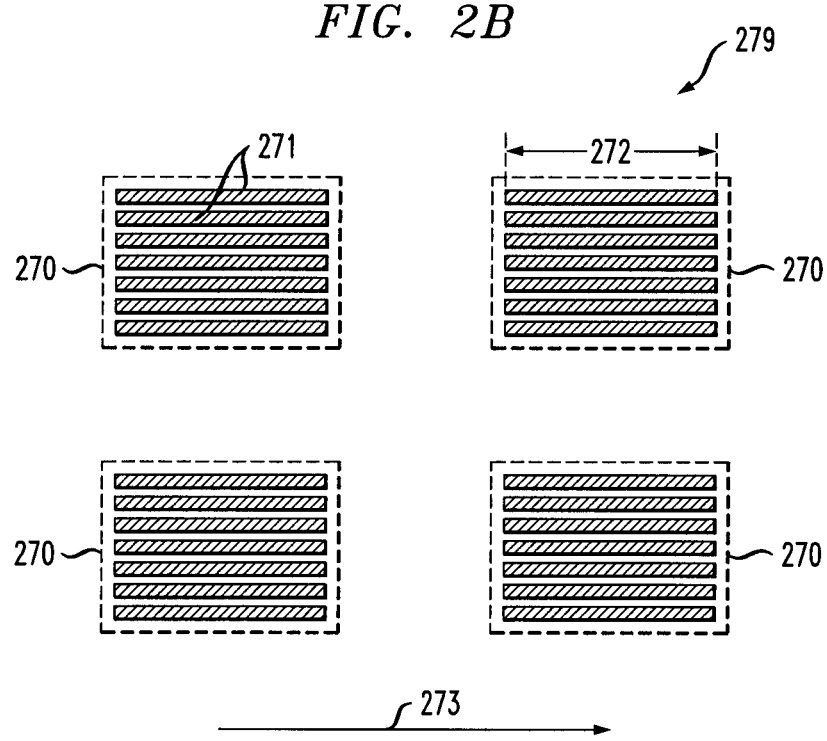
FIG. 2B shows a top down view of a through-wafer via system.

FIG. 2B illustrates a top down view of an exemplary through-wafer via system 279. More specifically, the through-wafer via system 279 comprises four composite through-wafer via structures 270. Each of the four composite through-wafer via structures 270 can comprise, for example, seven through-wafer vias 271.

In some instances, each of the four composite through-wafer via structures 270 is similar to the through-wafer via structure 200 of FIG. 2A. It should be noted that, the top pad structure 230, the bottom pad structure 240, and other layers of the four composite through-wafer via structures 270 are not shown in FIG. 2B for simplicity.

For each of the four composite through-wafer via structures 270, the seven through-wafer vias 271 can, for example, be formed simultaneously. Each of the four composite through-wafer via structures 270 can be formed, for example, in a manner similar to the manner in which the through-wafer via structure 200 of FIG. 2A is formed.

In some instances, all the twenty-eight through-wafer vias 271 of the through-wafer via system 279 have the same length 272. All the twenty-eight through-wafer vias 271 of the through-wafer via system 279 can, in at least some cases, run in the same direction 273. The four composite through-wafer via structures 270 can be arranged, for example, in an array of 2 rows and 2 columns as shown.

Figure 2C:
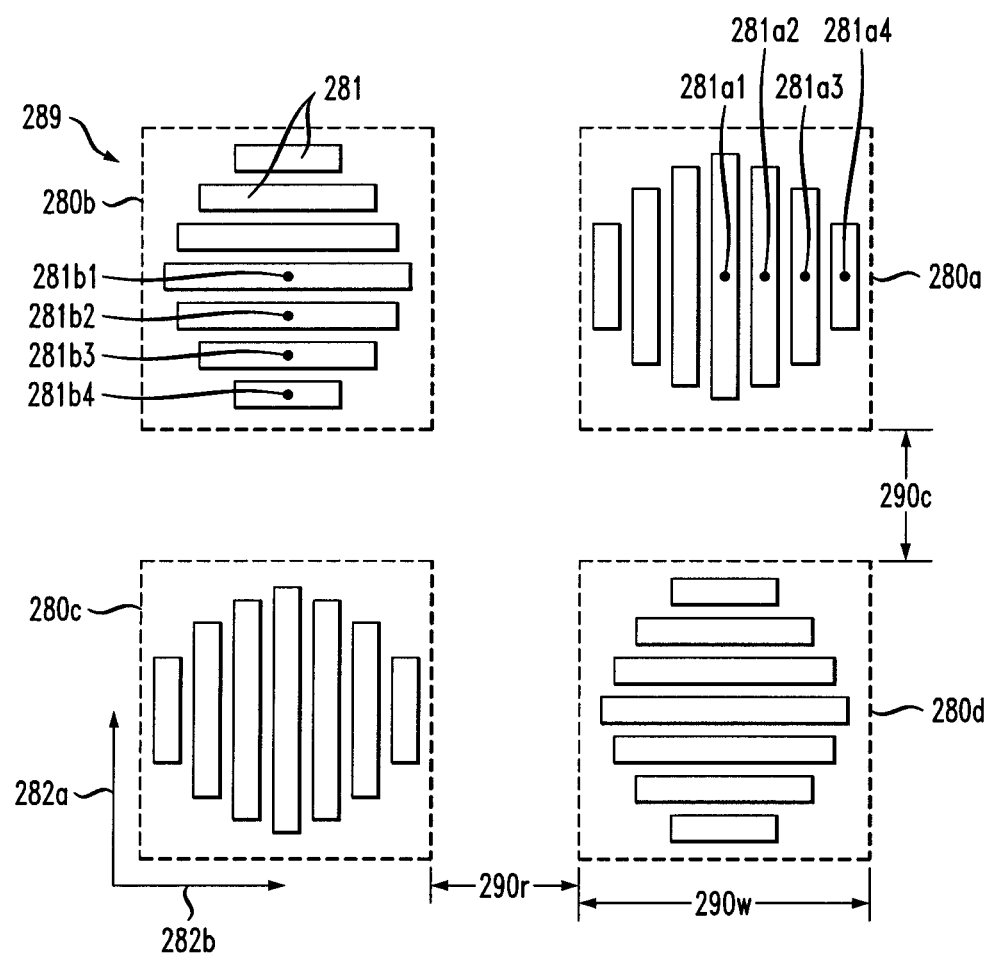
FIG. 2C shows a top down view of a through-wafer via system of FIG. 2B.

FIG. 2C shows a top down view of a through-wafer via system 289. More specifically, the through-wafer via system 289 can comprise, for example, four composite through-wafer via structures 280a, 280b, 280c, and 280d. Each of the four composite through-wafer via structures 280a, 280b, 280c, and 280d can comprise, for example, seven through-wafer vias 281.

In some instances, each of the four composite through-wafer via structures 280a, 280b, 280c, and 280d is similar to the composite through-wafer via structure 200 of FIG. 2A'. It should be noted that the top pad structure 230, the bottom pad structure 240, and other layers of the four composite through-wafer via structures 280*a*, 280*b*, 280*c*, and 280*d* are not shown in FIG. 2C for simplicity.

For each of the four composite through-wafer via structures 280*a*, 280*b*, 280*c*, and 280*d*, the seven through-wafer vias 281 can be formed, for example, simultaneously in a wafer (not shown). Each of the four through-wafer via structures 280*a*, 280*b*, 280*c*, and 280*d* can be formed, for example, in a manner similar to the manner in which the composite through-wafer via structure 200 of FIG. 2A is formed, except that for each of the four through-wafer via structures 280*a*, 280*b*, 280*c*, and 280*d* in the example of FIG. 2C, the lengths of the seven through-wafer vias 281 are not the same.

More specifically, for each of the four composite through-wafer via structures 280*a*, 280*b*, 280*c*, and 280*d*, when going from the center to the outside of the structure, the lengths of the seven through-wafer vias 281 become shorter and shorter.

For example, in the composite through-wafer via structure 280*a*, the length of a first through-wafer via 281*a*1 is greater than the length of a second through-wafer via 281*a*2, which is in turn greater than the length of a third through-wafer via 281*a*3, which is in turn greater than the length of a fourth through-wafer via 281*a*4.

For another example, the length of a first through-wafer via 281*b*1 is greater than the length of a second through-wafer via 281*b*2, which is in turn greater than the length of a third through-wafer via 281*b*3, which is in turn greater than the length of a fourth through-wafer via 281*b*4.

With reference to FIG. 2C, in one embodiment, the four composite through-wafer via structures 280*a*, 280*b*, 280*c*, and 280*d* are arranged in a manner similar to the manner in which the four composite through-wafer via structures 270 of FIG. 2B are arranged (i.e., in an array of 2 rows and 2 columns) except that when going from one structure to the next structure in the same row or the same column, the orientation of the seven through-wafer vias 281 changes 90 degrees.

For example, the seven through-wafer vias 281 of the composite through-wafer via structure 280*a* run in a direction 282*a*, whereas the seven through-wafer vias 281 of the composite through-wafer via structure 280*b* run in a direction 282*b* which is perpendicular to the direction 282*a*. In other words, when going from the composite through-wafer via structure 280*a* to composite through-wafer via structure 280*b* in the same row, the direction of the seven through-wafer vias 281 changes from the direction 282*a* to the direction 282*b* (i.e., changing 90 degrees).

For another example, the seven through-wafer vias 281 of the composite through-wafer via structure 280*a* run in the direction 282*a*, whereas the seven through-wafer vias 281 of the composite through-wafer via structure 280*d* run in the direction 282*b* which is perpendicular to the direction 282*a*. In other words, when going from the composite through-wafer via structure 280*a* to the composite through-wafer via structure 280*d* in the same column, the direction of the seven through-wafer vias 281 changes from the direction 282*a* to the direction 282*b* (i.e., changing 90 degrees).

Figure 3A:
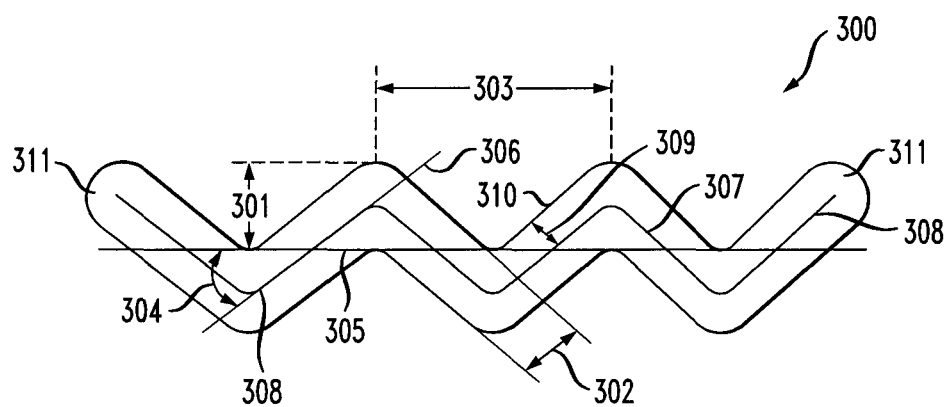
FIG. 3A shows a top down view of another through-wafer via.

FIG. 3A shows a top down view of a through-wafer via 300. More specifically, the through-wafer via 300 has a sinusoidal shape. In some instances, the through-wafer via structure 300 has a wavelength 303 of about 12 μm, a width 301 of about 4 μm, and a thickness 302 of about 3 μm. In some instances, the angle 304 formed by the centerline 305 and the segment axis 306 is about 45°. In some instances, the ends 311 of the through-wafer via 300 are rounded.

Assume that a trench is formed in place of the through-wafer via 300 (i.e., the trench has the same size, shape and location as the through-wafer via 300). Assume further that the trench is being filled with a filling material using CVD. As a result, the filling material grows from the side walls of the trench and converges to a convergence surface 307 in the trench. A plane parallel to a top surface of the semiconductor wafer would intersect the convergence surface 307 through a convergence curve 308. The length of the convergence curve 308 can be considered as the length of the through-wafer via 300. A convergence distance 309 is the distance by which the filling material grows from the side wall 310 of the trench to the convergence surface 307. In some instances, the length of the through-wafer via 300 is at least twenty times greater than the convergence distance 309.

Figure 3B:
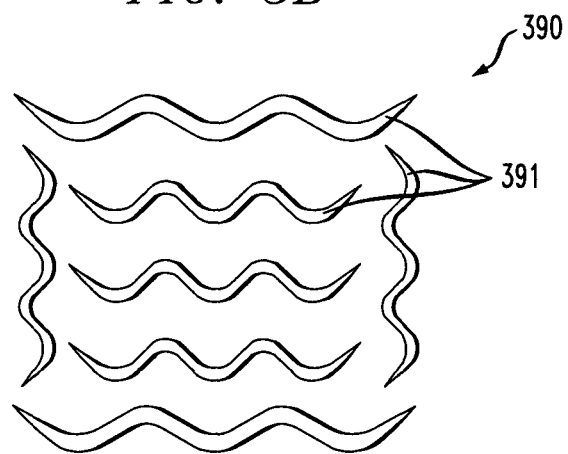
FIG. 3B illustrates a top down view of a through-wafer via structure utilizing the through-wafer via of FIG. 3A.

FIG. 3B illustrates a top down view of a composite through-wafer via structure 390. The composite through-wafer via structure 390 can be formed in a wafer (not shown). More specifically, the through-wafer via structure 390 can comprise multiple (seven shown here for illustration) through-wafer vias 391. Each of the seven through-wafer vias 391 is similar to the through-wafer via 300 of FIG. 3A. In some instances, the composite through-wafer via structure 390 has the shape of a rectangle. More specifically, four of the seven through-wafer vias 391 are at the four sides of the rectangle, the other three through-wafer vias 391 are arranged inside of the rectangle.

In summary, with reference to FIG. 1A, the length 110*b* of the through-wafer via trench 110 is much greater than the width 110*a* of the through-wafer via trench 110. As a result, although the depth 110*c* (FIG. 1Aii) of the through-wafer via trench 110 is much greater than the width 110*a* of the through-wafer via trench 110 (high-aspect ratio), the through-wafer via trench 110 can be filled with a metal (preferably tungsten) with high quality due to the length 110*b* being much greater than the width 110*a*.

In the examples above, with reference to FIG. 2B, the number of through-wafer vias 271 in each composite through-wafer via structures 270 is seven. In general, the through-wafer via structures 270 can have different numbers of through-wafer vias 271. For example, a first through-wafer via structure 270 can have five through-wafer vias 271, a second through-wafer via structure 270 can have six through-wafer vias 271, a third through-wafer via structure 270 can have seven through-wafer vias 271, and a fourth through-wafer via structure 270 can have eight through-wafer vias 271.

It should be noted that at least some aspects of the invention may also be applied to thin wafers and to wafers of any material (such as glass, metal, and ceramic) for which a suitable etching process can be found.

FIG. 4 shows a perspective view of a through-wafer via 410. The through-wafer via 410 is similar to the through-wafer via 120' of FIG. 1G (i.e., having the shape of a rectangular plate) except that the vertical edges 417 of the through-wafer via 410 are rounded. Similar to the through-wafer via 120' of FIG. 1G, the through-wafer via 410 has its length 411 much greater (e.g., at least 10 times greater) than its width 412.

Figure 5:
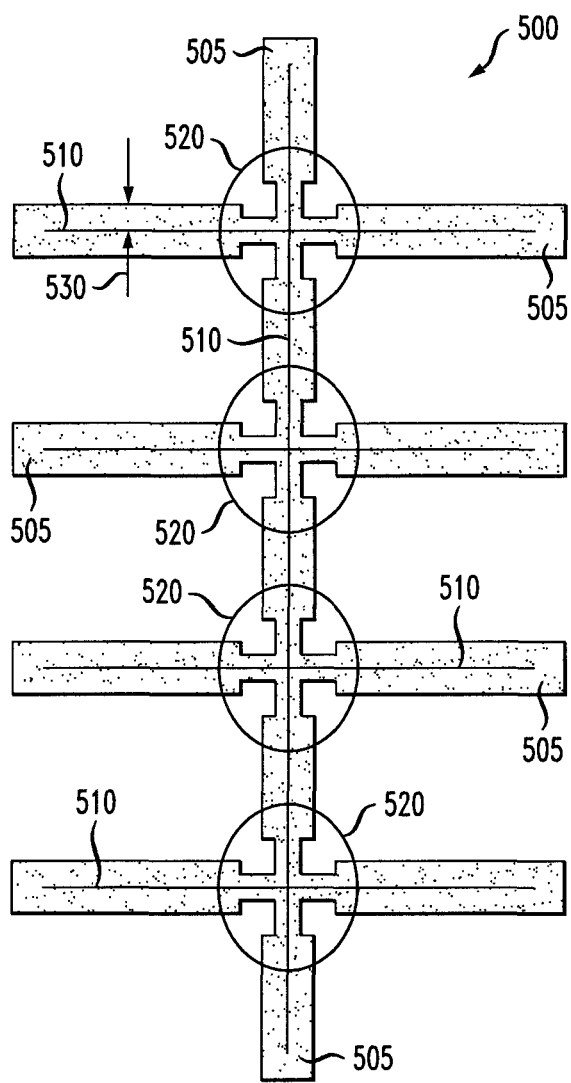
FIG. 5 shows a top view of a multi-branch via.

FIG. 5 shows a top-down view of a through-wafer via 500. The through-wafer via 500 can have multiple branches 505 and multiple intersections 520. Although the intersections 520 are all four-way in FIG. 5, in general the intersections of the through-wafer via 500 can be N-way (N is an integer greater than 2).

Assume that a trench is formed in place of the through-wafer via 500 (i.e., the trench has the same size, shape and location as the through-wafer via 500). Assume further that the trench is being filled with a filling material using CVD. As a result, the filling material grows from the side walls of the trench and converges to a convergence surface 510 in the trench. A plane parallel to the top surface of the semiconductor wafer would intersect the convergence surface 510 through a convergence curve (which coincides with the convergence surface 510 due to the top down view. Therefore, the same numeral 510 can be used for both). Because the through-wafer via 500 has multiple branches 505 and multiple intersections 520, the convergence curve 510 also has multiple branches and multiple intersections. In some instances, the total length of the convergence curve 510 is at least twenty times the convergence distance 530.

It should be noted that there is no closed loop in the convergence curve 510. Also, in some instances, the intersections 520 of the through-wafer via 500 are tailored such that the intersections 520 can be filled by a CVD process.

Embodiments of the invention provide via shapes (for example, silicon carrier via shapes) with superior mechanical properties. These shapes are significantly stronger than those in U.S. Patent Publication 2008-0274583 when metal fill of the via is incomplete.

Through wafer vias (TWV) are being developed worldwide for a variety of semiconductor technology applications. The TWVs are typically formed by etching out deep shapes in a Si wafer, insulating the vias (in most cases), filling the shapes with metal, and then thinning the backside of the wafer until the via metal is exposed. These structures are intended to pass power, ground and input(s)/output(s) (I/Os) from one side of the wafer to the other. Several processes for creating TWVs have been proposed and reduced to practice, with most typically taking the form of cylinders or square plugs, filled with Cu and/or a variety of other metals including tungsten, tin, solders, and the like.

One of the major drawbacks of either cylindrical or square via structures is that the volume filling requirements of such structures are usually well beyond what is considered to be standard complementary metal oxide semiconductor (CMOS) back-end-of-the-line (BEOL) processing. In the case of plated copper vias in a manufacturing environment, the aspect ratio has to be kept below ~5:1 to ensure good filling of the vias by copper damascene plating techniques. This imposes limits on the thickness of the wafer in which the TWVs are fabricated. As an example, if one wished to populate a 100 micron (μm) thick wafer with vias, the via diameter would have to be ~20 micron in order to preserve the 5:1 maximum aspect ratio requirement. However, even in this case, the damascene plating thickness required would have be on the order of 10 micron to ensure complete filling of the via from all sides. This is already well in excess of standard BEOL limits for plating.

Moreover, thermo-mechanical modeling of Cu cylinders embedded in silicon reveals serious copper stress and pumping issues as the volume increases due to the large coefficient of thermal expansion (CTE) mismatch between Cu (17 parts per million (ppm)) and Si (2.5 ppm). For thicker wafers with larger vias, the problem only becomes worse.

In order to combat the via fill volume and CTE mismatch issues, annular via structures and processes have been developed. The complete disclosure of co-assigned U.S. Patent Publication 2005-0121768 of Edelstein et al., entitled "Silicon chip carrier with conductive through-vias and method for fabricating same," published on Jun. 9, 2005, is expressly incorporated herein by reference in its entirety for all purposes. The complete disclosure of co-assigned U.S. Pat. No. 7,488,680 of Andry et al., entitled "Conductive Through Via Process fro Electronic Device Carriers," issued Feb. 10, 2009, is also expressly incorporated herein by reference in its entirety for all purposes. The two publications just mentioned disclose processes related to etching and filling of annular vias. The skilled artisan will be familiar with the contents of these documents.

Annular metal structures possess a core of CTE-matched Si for thermal stability, and require much less metal to form the conductive element than standard cylinders. Annular vias filled with copper by standard damascene plating have been achieved up to an aspect ratio of about 7:1. Special plating techniques under development may extend this up to ~20:1. However, standard CMOS middle-of-the-line CVD metal deposition of tungsten has already been successfully used up to vias with aspect ratios of ~25:1 with no special enhancements. Tungsten-filled vias have been shown to be robust against thermal cycling and have sufficiently low resistance to be used practically for both I/O and power/ground connections.

One drawback of the annular structure is seen when the metal fill is found to be incomplete, leaving a central seam between the inner and outer walls. In such a case, when the wafer is thinned, the seam can become a complete discontinuity between the inner core and the rest of the wafer, allowing the central portion of the cylinder to be displaced or in extreme cases, fall out completely.

One or more embodiments of the invention provide one or more thin, high-aspect ratio structures which reduce or eliminate this problem. Aspect ratio in this case describes not only the height of the vias relative to their width (z-axis relative to x-axis) but also to their in-plane length relative to their width (y-axis relative to x-axis). This is a significant aspect of the invention. In general, it is preferred that both aspect ratios should be greater than 10:1.

One or more via structures in accordance with one or more embodiments of the invention preferably have one, some, and most preferably all of the following properties:
1. a hole cross-section that is thin (~3 um) in one dimension while long in the other
2. is topologically connected so that no part can drop out on wafer thinning
3. is made up of structures that all have the same curvature so that the DRIE etching depths are uniform
4. is built into filled via structures as described in the US Patent Publication 2008-0274583.

Designs are preferably "C" shapes, an example of which includes annuli with a break. An annulus is of course the area between two concentric circles having different radii. An annulus with a break is a segment of an annulus which is not complete, thus forming a C-shape. A C-shape as used herein is defined to include annuli with breaks, and also similar shapes with breaks, e.g., oblong or elliptical rings with breaks. The breaks may be fairly large (say almost half the shape, i.e., subtending just less than 180 degrees of arc for an annulus) or may be quite small such that the shape is almost closed (say, break is 2-3 microns). A C-shape as used herein also includes annuli with breaks wherein the annuli are not of a single fixed radius, as in FIG. 14.

One advantage of one or more embodiments of these new shapes over the previous bar shapes is that if the metal fill of the vias is not complete, the vias are much stronger under bending of the die and tension in the die plane. This is because the more rounded shapes reduce stress concentrations.

These designs approximate the stress concentrations seen with the older annular vias described in U.S. Pat. No. 7,488, 680, but because the core is attached at the (potential) break in the annulus, the core cannot drop out if the filling is incomplete.

Figure 6:
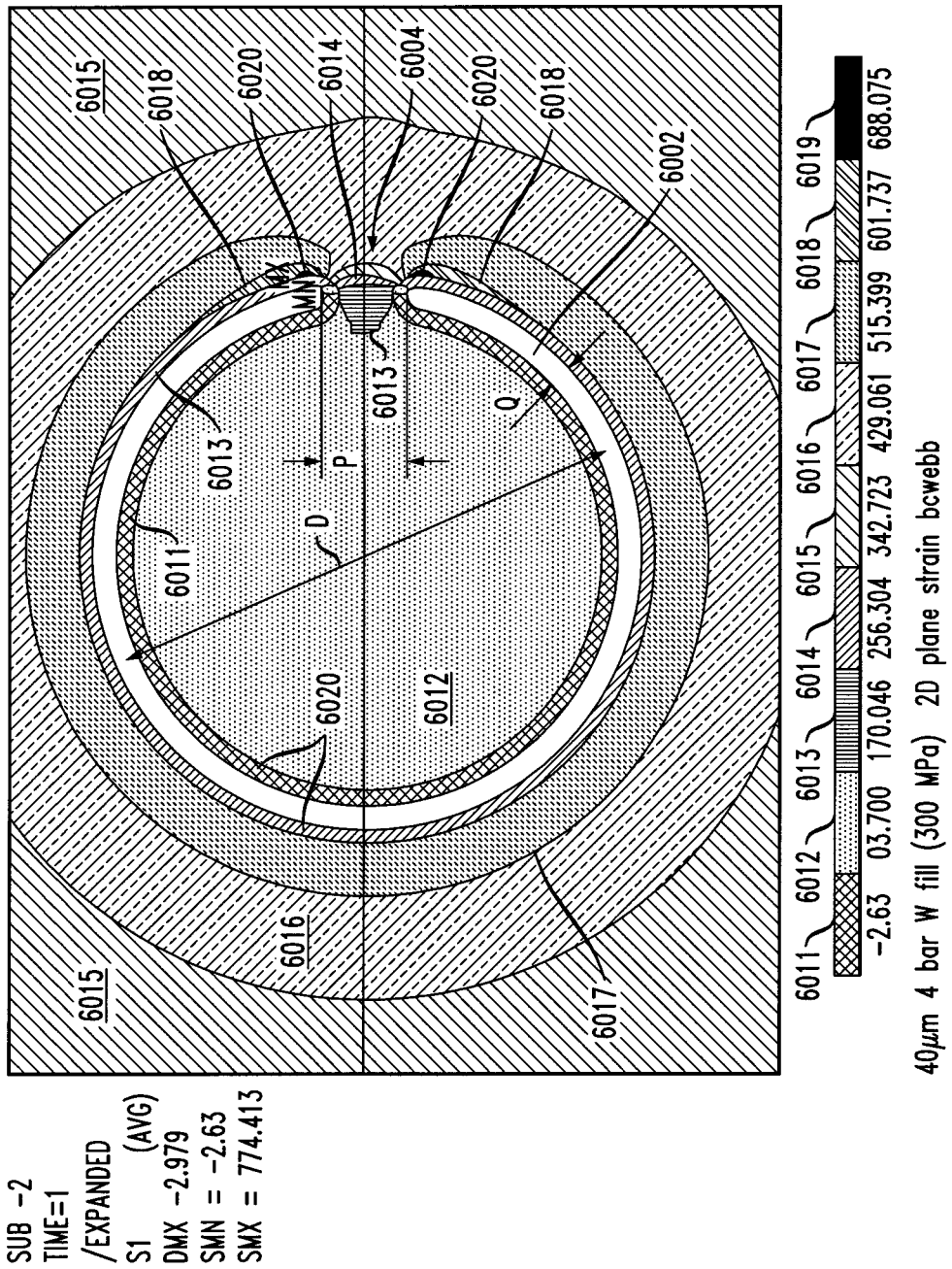
FIG. 6 shows a cross section of an exemplary embodiment of a via, according to an aspect of the invention, having a ring shape with a break therein.

A first exemplary C-shape is depicted in FIGS. 6 and 12. The cross-section of the via in the plane of the wafer is a ring shape 6002 with a break 6004. The contours 6011-6019 show the stress with a 300 mega-Pascal (MPa) applied biaxial stress, with 6011 the lowest and 6019 the highest. The peak stress is similar to that of a continuous annulus. The "liner" 6020 to the ring shaped via hole 6002 with break 6004 is the thermal oxide insulating layer. The metal fill in the ring shaped via hole 6002 with break 6004 is not shown in FIG. 6, but is denoted as 6002' in FIG. 12. The width P of the break 6004 is preferably between one and four times the gap Q (Q is the width of the ring shaped via hole 6002 that has to be filled with metal). The break 6004 could be much larger but it is reasonable to maximize the amount of metal area. The diameter D is preferably between 10 microns and 100 microns depending on how small the vias need to be. The gap Q is optimally around 2 microns to 3 microns for tungsten filled parts, although it could be a few times larger for copper filled vias.

Note that a gap is also referred to herein as a fill gap and refers to the hole that is filled with metal to form the via, while a break refers to the discontinuity in the annulus or other via shape.

Figure 7:
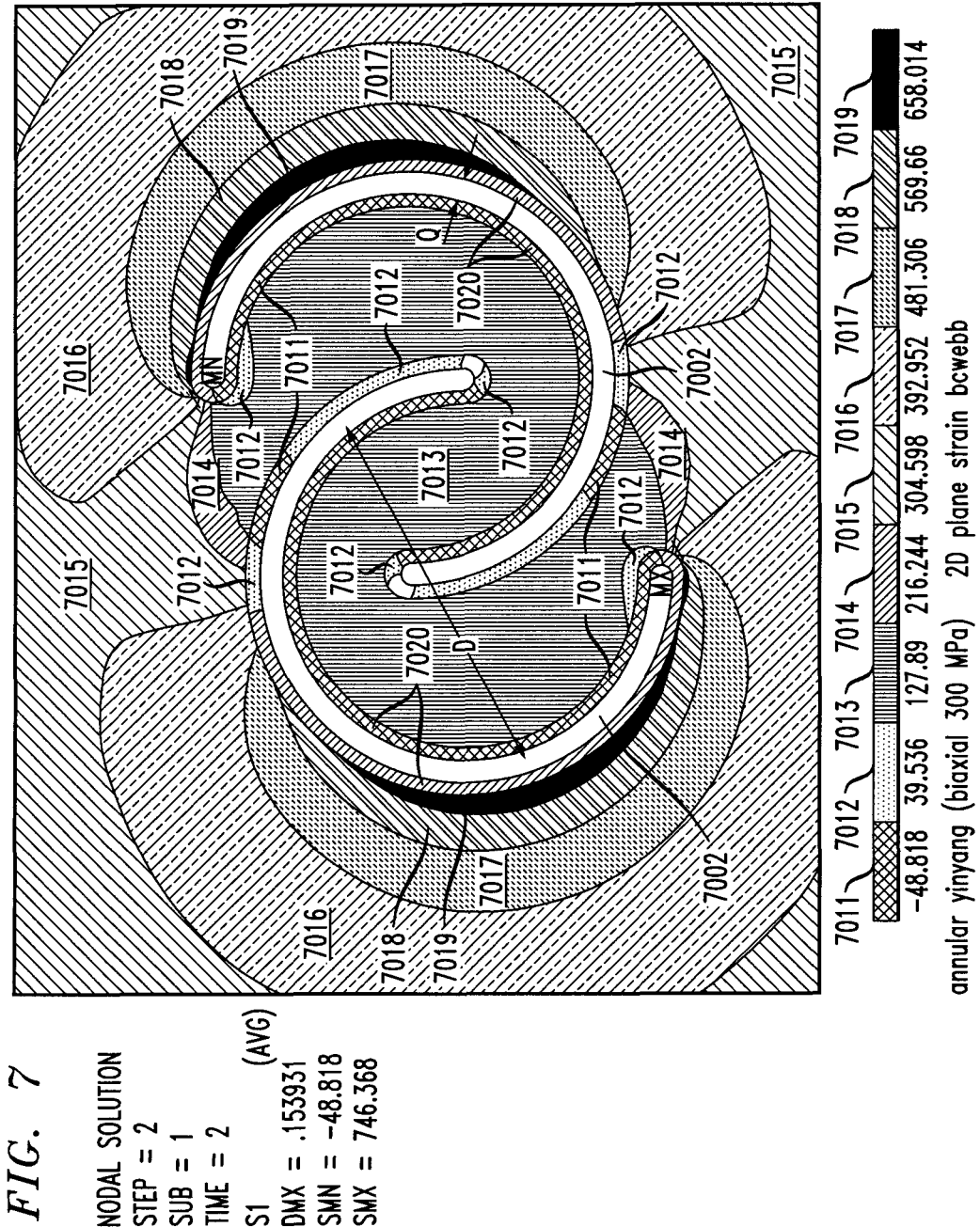
FIG. 7 shows a cross section of an exemplary embodiment of a via, according to another aspect of the invention, having two linked "C" shapes.
Figure 8:
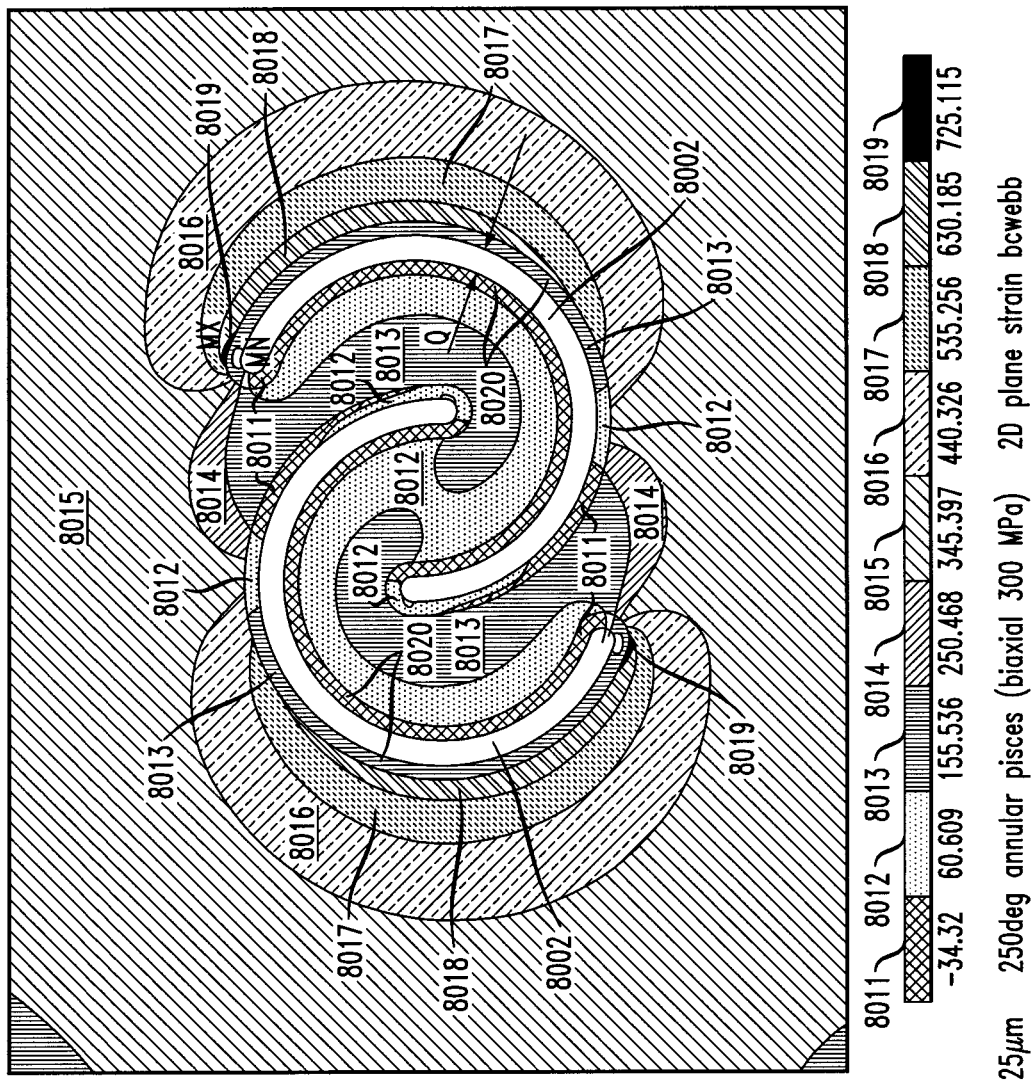
FIG. 8 shows a cross section of an exemplary embodiment of a via, according to still another aspect of the invention, having two linked "C" shapes and adapted to fit in a small area.

Note that in FIGS. 6-8, the stresses are predicted using the well-known ANSYS® finite element analysis computer software, available from ANSYS, Inc., 275 Technology Drive, Canonsburg, Pa. 15317 USA. The loads, stress patterns, and stress values are exemplary and different results may be obtained in different embodiments. Further, the minimum stress is denotes as "MN" and the maximum stress is denoted as "MX."

Note that FIGS. 6-9 and 12-15 are wafer face views (i.e., cross sections in the planes of the vias). The interiors of the vias are filled metal, optionally surrounded by insulator, and in turn surrounded by the wafer material (e.g., silicon).

A second exemplary shape is depicted in FIG. 7 (and suggested in FIG. 13). Here, the exemplary via includes two linked "C" shapes 7002. There is a similar total amount of metal area, but the core regions are more solidly supported. This example is for rings 7002 having a diameter D of 50 microns. Elements in FIG. 7 that are similar to those in FIG. 6 have received the same reference character incremented by one thousand, it being understood that the bands of relative stress may have different absolute values in the two figures. "D" is used for diameter in both figures. Again, the metal fill of the rings 7002 is not shown in FIG. 7 but is denoted as 7002' in FIG. 13.

A third exemplary shape is shown in FIGS. 8 and 13. The shape is similar to FIG. 7, but is modified to fit into a 40 micron area; i.e., the example will fit in a 40 micron square for the 2 micron fill gap in the figure. However, the same shape can be scaled to bigger and smaller fill gaps and overall size without changing the stress factors. A similar shape with different proportions will also be a good shape. Here, the exemplary via includes two 250 degree 25 micron to-gap-center partial annuli 8002. The notation "250 degrees" means that each annulus subtends 250 degrees of arc out of 360 degrees of arc for a complete circle. The notation "25 micron to-gap-center" means the diameter is 25 microns measured to the mid-diameter of the filled hole. The annular centers 8060 are each offset 7.5 microns in the x-direction ($O_x$=7.5 microns) and 1 micron in the y-direction ($O_y$=1 micron) from the pattern center 8062. The stress concentration factor is 2.4 as compared to 8 for the configuration in FIG. 15. The length is 220 microns, comparable to a one-break 40 micron annulus. In this context, "length dimension" is the length arc centered within the hole. This is calculated in order to use length times fill gap to calculate the approximate cross sectional area of the hole to calculate the electrical resistance—more cross sectional area is better with smaller resistance.

Figure 14:
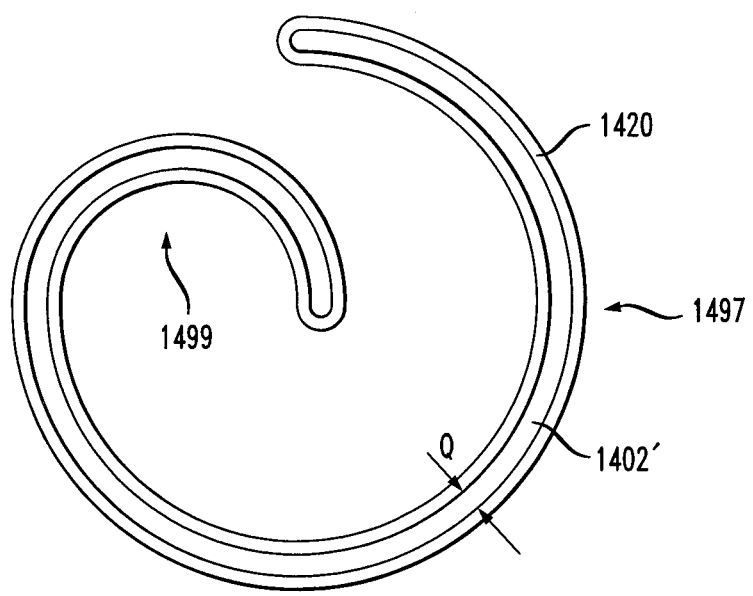
FIG. 14 shows an exemplary via configuration with a ¾ annulus at 50 microns diameter and a ½ annulus at 20 microns diameter.

A wide variety of variations are possible. One example, shown in FIG. 14, is for small vias, say 50 micron diameter, and similar to the bar via in stress, but again the stress is along the bar, and does not try to tear the tungsten seam. This example is a ¾ annulus 1497 at 50 micron diameter and a ½ annulus 1499 at 20 um diameter (note metal fill 1402' and insulator 1420). A potentially undesirable characteristic is that the curvature varies.

Figure 9:
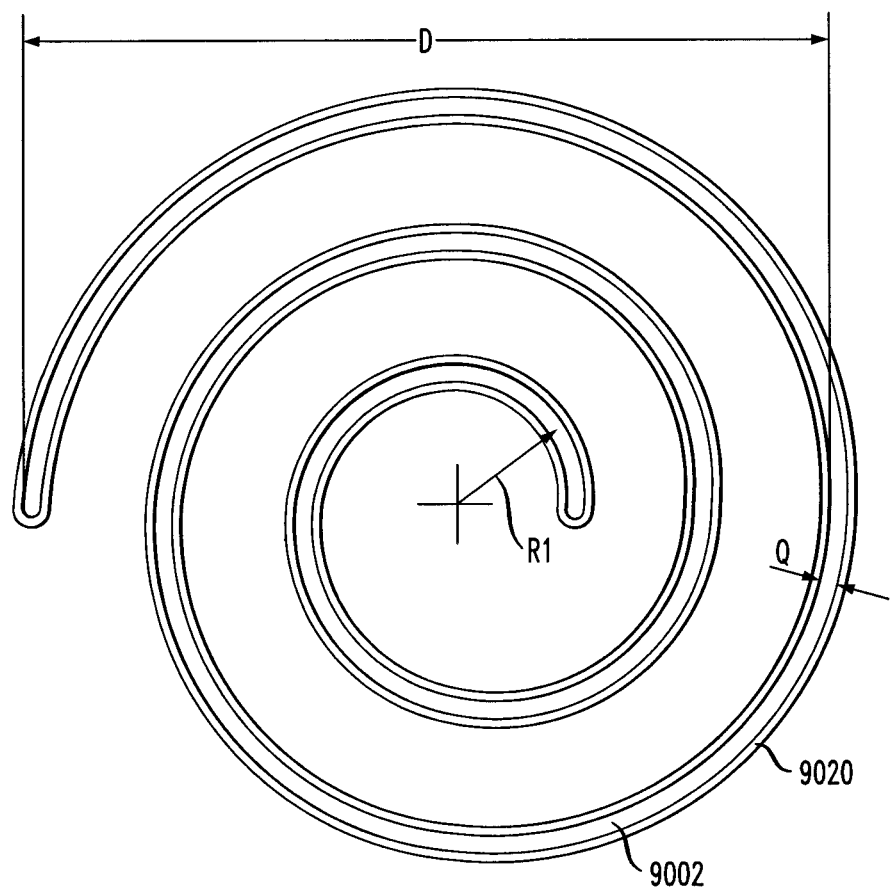
FIG. 9 shows a cross section of an exemplary embodiment of a via, according to yet another aspect of the invention, having a spiral shape with constant curvature.

A second possible variation (more desirable in at least some instances) is a spiral shape 9002 with constant curvature, as seen in FIG. 9. The example in FIG. 9 has a 10 micron initial radius R1, increasing by 12 microns per rotation. This example is a 100 micron diameter via (D=100 microns). In order to obtain smaller vias with this approach, a desirable shape is one that reduces the length of the spiral to fit the available envelope. Note insulation 9020. Again, the "length" is centered within the hole.

Figure 15:
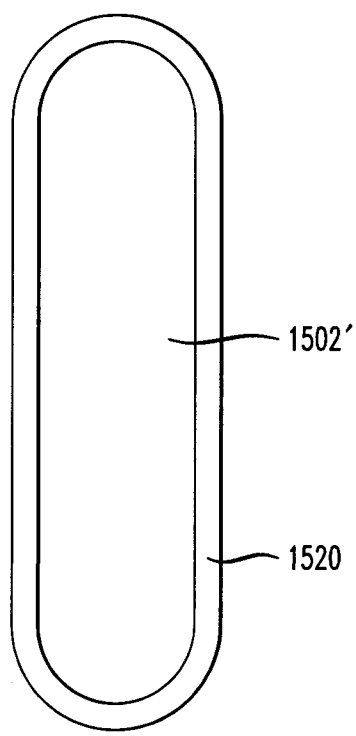
FIG. 15 shows a bar via for stress concentration factor comparison.

FIG. 15 shows a bar via 1502' for stress concentration factor comparison. The stress factor is about 8.0 for a 50 micron long bar via. Note ring of dielectric insulator 1520.

In further regard to stress concentration factors, the same may be defined as the ratio of highest stress to a reference stress of the gross cross section. The usual case is that a silicon wafer is subjected to sideways stress by bending due to clamping forces, impacts or surface coatings that warp the wafer. The usual dominant load term that results is biaxial (uniform stress in all directions in the plane of the wafer) stress, tensile on one side (the convex side) and compressive on the other. The stress concentration factors are calculated for the wafer surface around the hole made for the via. The amount of bend can be used to predict the net biaxial stress. The stress concentration factor multiplied by the applied biaxial stress reveals the peak principal stress in the silicon near the hole. Silicon is a brittle material that will fracture when the peak principal stress exceeds the intrinsic strength of silicon, a number near 2 GPa, although the value can be reduced by microscopic flaws in the silicon from crystal defects and damage due to the hole etching process.

Note that any dimensions quoted or depicted in the discussion of FIGS. 6-9 and 12-15 are approximate, and can vary in other embodiments. Diameters are to the midpoint between inner and outer edges of the via hole. Since the fill gap tends to shrink more slowly than the other dimensions for smaller through vias, this leads to somewhat different possible shapes for smaller vias. The fill thickness Q is somewhat fixed, in the range between about 0.3 microns to 3 microns, so accessible shapes change to some extent as the parts get smaller.

One way of characterizing these different exemplary designs is to use the ratio of the via dimensions to the fill gap as a differentiator between different layouts. Thus, the configuration shown in FIG. 14 may not be especially appropriate if the diameter to gap ratio is less than approximately ten. The pure annulus with a break, as seen in FIGS. 6 and 12, can be used down to a diameter to gap ratio D/Q of about four. The interleaved C-shapes seen in FIGS. 7, 8, and 13 will typically not be appropriate for a diameter (of each "C") to gap ratio less than about six. The interleaved C-shape has a larger cross-sectional area (and thus lower resistance) than the pure annulus, where it can be used. The different exemplary designs thus are complimentary for different via sizes.

Given the discussion thus far, it will be appreciated that, in general terms, a structure, according to an aspect of the invention, includes a wafer 100 having a top wafer surface. The wafer defines an opening 6002, 7002, 8002, 9002, or having the general shape of metal 1402'. The top wafer surface defines a first reference direction perpendicular to the top wafer surface (e.g., a Z-axis coming out of the paper in FIGS. 8 and 13, for example, with the X and Y axes defining two additional reference directions and the thumb pointing in the Z-direction when curling X into Y with the fingers, according to the so-called right hand rule). The wafer has a thickness in the first reference direction. The structure also includes a through-wafer via 6002', 7002', 8002', 1402', or having shape of 9002, formed in the opening. The through-wafer via has a shape, when viewed in a plane perpendicular to the first reference direction and parallel to the top wafer surface, of at least one of a spiral (FIG. 9) and a C-shape (FIGS. 6-8, and 12-14). The through-wafer via has a height in the first reference direction essentially equal to the thickness of the wafer in the first reference direction. As best seen in FIG. 1G, "essentially equal" means equal or differing only by a small amount such as the thickness of dielectric layer 115.

Preferably, the through-wafer via has a width when viewed in the plane perpendicular to the first reference direction and parallel to the top wafer surface, a length when viewed in the plane perpendicular to the first reference direction and parallel to the top wafer surface, a first aspect ratio of at least ten to one and a second aspect ratio of at least ten to one. The first aspect ratio is the ratio of the height of the through-wafer via in the first reference direction to the width (fill gap). The second aspect ratio is the ratio of the length of the through-wafer via to the width (fill gap). For interrupted annuli (example of C-shape), the width is Q and the length is $\pi$ times the diameter times the number of degrees subtended divided by 360. For multiple C-shapes, add the length of all the shapes. For a spiral, use a width analogous to Q for the C-shape and a length of the "unrolled" spiral (which can be calculated from known mathematical formulas). For configurations like FIG. 14, the width is Q and the length is the sum of $\pi$ times the diameter times the number of degrees subtended divided by 360, for each segment.

One or more embodiments include a dielectric layer 6020, 7020, 8020, 9020, 1420, which is sandwiched between the through-wafer via and the wafer. The dielectric layer is in direct physical contact with the through-wafer via and the wafer. One or more embodiments include a top pad structure 130, which is on top of the through-wafer via. The top pad structure 130 is in direct physical and electrical contact with the through-wafer via and in direct physical contact with the dielectric layer. Note that "top" and "bottom" are relative terms of convenience and do not necessarily imply any specific orientation with respect to the gravity vector. The top pad structure may include, for example, copper or aluminum. In one or more embodiments, the through-wafer via has a bottom surface, and a bottom pad structure 140 is located on the bottom surface of the through-wafer via. The bottom pad structure is in direct physical contact with the through-wafer via and the wafer. The bottom pad structure may include, for example, copper or aluminum.

The through-wafer via can be formed, for example, from copper or tungsten. Highly doped silicon can also be used but is less desirable due to high resistivity.

The shape of the through-wafer via can be the C-shape as in FIGS. 6 and 12; interlocked first and second C-shapes as in FIGS. 7, 8, and 13; alternative C-shape as in FIG. 14, or a spiral as in FIG. 9. In some instances, the C-shape is an annulus with a break, the annulus has a diameter and a fill gap, and the ratio of the diameter to the fill gap is at least four. In some cases, the interlocked first and second C-shapes each comprise an annulus with a break, said annuli each have a diameter and a fill gap, and the ratio of the diameter of each of the annuli to the fill gap is at least six; the interlocked C-shapes can each subtend about (say, plus or minus ten percent) 250 degrees. In general, the angle and placement of the interlocking C-shapes can be chosen to ensure a minimum distance of at least twice the fill gap Q between adjacent parts to avoid having holes run into each other due to limitations in resolution. As in FIG. 14, the C-shape can include a three-quarter annulus of a first annulus diameter and a one-half annulus at a second annulus diameter about forty percent of the first annulus diameter. In this case, C-shape has a fill gap, and the ratio of the first annulus diameter to the fill gap is at least ten.

Preferably, the through-wafer via exhibits uniform curvature when viewed in a plane perpendicular to the first reference direction and parallel to the top wafer surface. Preferably, the through-wafer via and adjacent portions of the wafer exhibit cooperative topological connectivity, to avoid the issues with pieces coming loose, as described above.

It should be noted that the C-shaped and spiral vias of FIGS. 6-9, and 12-14 can be substituted for the other shapes of vias shown elsewhere herein.

It will be further appreciated, given the discussion thus far, that an exemplary method, according to another aspect of the invention, includes the steps of providing a wafer having a top wafer surface, as described above; and forming a through-wafer via trench in the wafer. The through-wafer via trench has a shape, when viewed in a plane perpendicular to the first reference direction and parallel to the top wafer surface, of at least one of a spiral and a C-shape, as described above. The through-wafer via trench has a height in the first reference direction less than the thickness of the wafer in the first reference direction (preferably, material is later removed as described elsewhere, so that after the trench is filled the resulting via has a height essentially equal to the remaining thickness of the wafer in the Z-direction).

In the forming step, the through-wafer via trench can have a width when viewed in the plane perpendicular to the first reference direction and parallel to the top wafer surface, a length when viewed in the plane perpendicular to the first reference direction and parallel to the top wafer surface, a first aspect ratio of at least ten to one and a second aspect ratio of at least ten to one, the first aspect ratio comprising a ratio of the height of the through-wafer via trench in the first reference direction to the width (fill gap), the second aspect ratio comprising a ratio of the length of the through-wafer via trench to the width (fill gap). It will be appreciated that the first aspect ratio may be more than ten to one so that the resulting via can have a first aspect ratio of at least ten to one after removal of material.

The method can further include forming a dielectric layer on side walls and bottom walls of the through-wafer via trench, as seen in FIGS. 1Bi and 1Bii. The method can also include, after the forming of the dielectric layer, filling the through-wafer via trench with an electrically conductive material to form a through-wafer via 6002', 7002', 8002', metal-filled 9002, 1402', in the through-wafer via trench. Material can be removed from the bottom surface as shown in FIG. 1F until a bottom surface of the through-wafer via is exposed to surrounding ambient. A bottom pad structure 140 can be formed on a ground surface of the through-wafer via such that the bottom pad structure is in direct physical contact with the through-wafer via, as in FIG. 1G.

In the forming step, the shape of the through-wafer via trench can include any of the shapes shown in FIGS. 6-9, and 12-14. As noted, the through-wafer via trench preferably exhibits uniform curvature when viewed in a plane perpendicular to the first reference direction and parallel to the top wafer surface.

Design Structure Aspects

Figure 10:
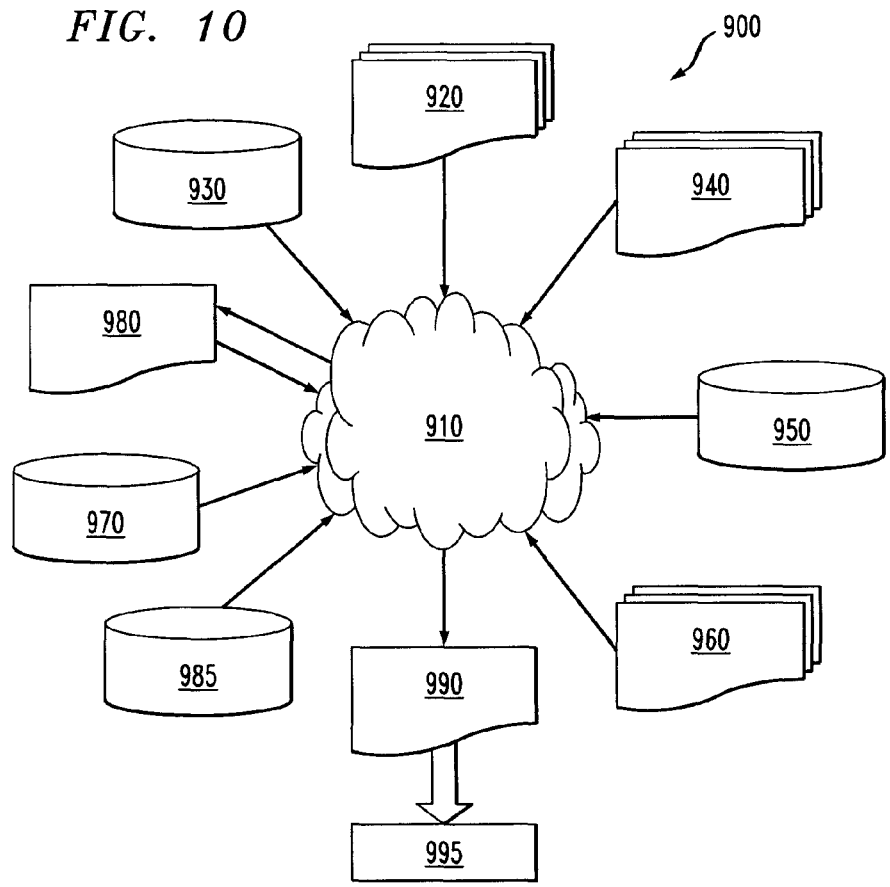
FIG. 10 is a flow diagram of a design process used in semiconductor design, manufacture, and/or test.

FIG. 10 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 6-9, and 12-14. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 10 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 6-9, and 12-14. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 6-9, and 12-14 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means. Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 6-9, and 12-14. In one embodiment, design structure 990 may comprise a compiled, executable HDL simulation model that functionally simulates the devices shown in FIGS. 6-9, and 12-14.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 6-9, and 12-14. Design structure 990 may then proceed to a stage 995 where, for example, design structure 990: proceeds to tape-out, is released to manufacturing, is released to a mask house, is sent to another design house, is sent back to the customer, etc.

Exemplary System and Article of Manufacture Details

A variety of techniques, utilizing dedicated hardware, general purpose processors, firmware, software, resident software, micro-code, and so on) or a combination of the foregoing may be employed to carry out the design process just described, and the like. The design process, for example, can make use of software running on a general purpose computer or workstation. Some instances can employ a computer product including a computer readable medium with computer usable program code for performing steps, and/or an apparatus including a memory and at least one processor that is coupled to the memory and operative to perform steps.

Figure 11:
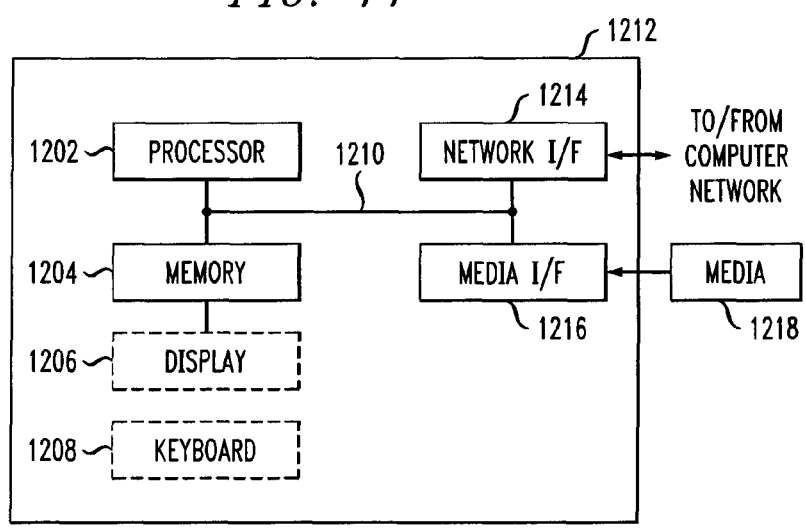
FIG. 11 depicts a computer system that may be useful in implementing the design process of FIG. 10.

The design process can make use of software running on a general purpose computer or workstation. With reference to FIG. 11, such design process might employ, for example, a processor 1202, a memory 1204, and an input/output interface formed, for example, by a display 1206 and a keyboard 1208. The term "processor" as used herein is intended to include any processing device, such as, for example, one that includes a CPU (central processing unit) and/or other forms of processing circuitry. Further, the term "processor" may refer to more than one individual processor. The term "memory" is intended to include memory associated with a processor or CPU, such as, for example, RAM (random access memory), ROM (read only memory), a fixed memory device (for example, hard drive), a removable memory device (for example, diskette), a flash memory and the like. In addition, the phrase "input/output interface" as used herein, is intended to include, for example, one or more mechanisms for inputting data to the processing unit (for example, mouse), and one or more mechanisms for providing results associated with the processing unit (for example, printer). The processor 1202, memory 1204, and input/output interface such as display 1206 and keyboard 1208 can be interconnected, for example, via bus 1210 as part of a data processing unit 1212. Suitable interconnections, for example via bus 1210, can also be provided to a network interface 1214, such as a network card, which can be provided to interface with a computer network, and to a media interface 1216, such as a diskette or CD-ROM drive, which can be provided to interface with media 1218.

Accordingly, computer software including instructions or code for performing the design process, as described herein, may be stored in one or more of the associated memory devices (for example, ROM, fixed or removable memory) and, when ready to be utilized, loaded in part or in whole (for example, into RAM) and implemented by a CPU. Such software could include, but is not limited to, firmware, resident software, microcode, and the like.

A data processing system suitable for storing and/or executing program code will include at least one processor 1202 coupled directly or indirectly to memory elements 1204 through a system bus 1210. The memory elements can include local memory employed during actual implementation of the program code, bulk storage, and cache memories which provide temporary storage of at least some program code in order to reduce the number of times code must be retrieved from bulk storage during implementation.

Input/output or I/O devices (including but not limited to keyboards 1208, displays 1206, pointing devices, and the like) can be coupled to the system either directly (such as via bus 1210) or through intervening I/O controllers (omitted for clarity).

Network adapters such as network interface 1214 may also be coupled to the system to enable the data processing system to become coupled to other data processing systems or remote printers or storage devices through intervening private or public networks. Modems, cable modem and Ethernet cards are just a few of the currently available types of network adapters.

As used herein, including the claims, a "server" includes a physical data processing system (for example, system 1212 as shown in FIG. 11) running a server program. It will be understood that such a physical server may or may not include a display and keyboard.

As noted, elements to aid the design process may take the form of a computer program product embodied in one or more computer readable medium(s) having computer readable program code embodied thereon. Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. Media block 1218 is a non-limiting example. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the design process may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects are described herein with reference to flowchart illustrations and/or block diagrams of methods, apparatus (systems) and computer program products. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It should be noted that aspects of the design process can include an additional step of providing a system comprising distinct software modules embodied on a computer readable storage medium; the modules can include, for example, any or all of the components shown in FIG. 10 and/or described in connection therewith. The method steps can then be carried out using the distinct software modules and/or sub-modules of the system, as described above, executing on one or more hardware processors 1202. Further, a computer program product can include a computer-readable storage medium with code adapted to be implemented to carry out one or more method steps, including the provision of the system with the distinct software modules.

In any case, it should be understood that the components illustrated herein may be implemented in various forms of hardware, software, or combinations thereof; for example, application specific integrated circuit(s) (ASICS), functional circuitry, one or more appropriately programmed general purpose digital computers with associated memory, and the like. Given the teachings of the invention provided herein, one of ordinary skill in the related art will be able to contemplate other implementations of the components of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A structure, comprising:
   a wafer having a top wafer surface, said wafer defining an opening, said top wafer surface defining a first reference direction perpendicular to said top wafer surface, said wafer having a thickness in said first reference direction; and
   a through-wafer via formed in said opening, said through-wafer via having a shape, when viewed in a plane perpendicular to said first reference direction and parallel to said top wafer surface, of at least one of a spiral and a C-shape, said through-wafer via having a height in said first reference direction essentially equal to said thickness of said wafer in said first reference direction, wherein said through-wafer via has a width when viewed in said plane perpendicular to said first reference direction and parallel to said top wafer surface, a length when viewed in said plane perpendicular to said first reference direction and parallel to said top wafer surface, a first aspect ratio of at least ten to one and a second aspect ratio of at least ten to one, said first aspect ratio comprising a ratio of said height of said through-wafer via in said first reference direction to said width, said second aspect ratio comprising a ratio of said length of said through-wafer via to said width.

2. The structure of claim 1, further comprising:
a dielectric layer, said dielectric layer being sandwiched between said through-wafer via and said wafer, said dielectric layer being in direct physical contact with said through-wafer via and said wafer;
a top pad structure, said top pad structure being on top of said through-wafer via, said top pad structure being in direct physical and electrical contact with said through-wafer via and in direct physical contact with said dielectric layer, wherein said through-wafer via has a bottom surface; and
a bottom pad structure, said bottom pad structure being on said bottom surface of said through-wafer via, said bottom pad structure being in direct physical contact with said through-wafer via and said wafer.

3. The structure of claim 1, wherein said through-wafer via comprises a material selected from the group consisting of copper, tungsten, and highly doped silicon.

4. The structure of claim 1, wherein said shape of said through-wafer via comprises said C-shape.

5. The structure of claim 4, wherein said C-shape comprises an annulus with a break, said annulus having a diameter and a fill gap, a ratio of said diameter to said fill gap being at least four.

6. The structure of claim 1, wherein said shape of said through-wafer via comprises interlocked first and second C-shapes.

7. The structure of claim 6, wherein said interlocked first and second C-shapes each comprise an annulus with a break, said annuli each having a diameter and a fill gap, a ratio of said diameter of each of said annuli to said fill gap being at least six.

8. The structure of claim 7, wherein said C-shapes each subtend about 250 degrees.

9. The structure of claim 1, wherein said shape of said through-wafer via comprises said spiral.

10. The structure of claim 1, wherein said shape of said through-wafer via comprises said C-shape, said C-shape in turn comprising a three-quarter annulus of a first annulus diameter and a one-half annulus at a second annulus diameter about forty percent of said first annulus diameter.

11. The structure of claim 10, wherein said C-shape has a fill gap, a ratio of said first annulus diameter to said fill gap being at least ten.

12. The structure of claim 1, wherein said through-wafer via exhibits uniform curvature when viewed in a plane perpendicular to said first reference direction and parallel to said top wafer surface.

13. The structure of claim 1, wherein said through-wafer via and adjacent portions of said wafer exhibit cooperative topological connectivity.

14. A method comprising the steps of:
providing a wafer having a top wafer surface, said top wafer surface defining a first reference direction perpendicular to said top wafer surface, said wafer having a thickness in said first reference direction;
forming a through-wafer via trench in said wafer, said through-wafer via trench having a shape, when viewed in a plane perpendicular to said first reference direction and parallel to said top wafer surface, of at least one of a spiral and a C-shape, said through-wafer via trench having a height in said first reference direction less than said thickness of said wafer in said first reference direction;
filling said through-wafer via trench with an electrically conductive material to form a through-wafer via in said through-wafer via trench; and
after said filling of said through-wafer via trench with said electrically conductive material, removing material from a bottom surface of said wafer until a bottom surface of said through-wafer via is exposed to a surrounding ambient, said through-wafer via having a height in said first reference direction essentially equal to said thickness of said wafer in said first reference direction after removing the material from the bottom surface of said wafer, wherein said through-wafer via has a width when viewed in said plane perpendicular to said first reference direction and parallel to said top wafer surface a length when viewed in said plane perpendicular to said first reference direction and parallel to said top wafer surface, a first aspect ratio of at least ten to one and a second aspect ratio of at least ten to one, said first aspect ratio comprising a ratio of said height of said through-wafer via in said first reference direction to said width, said second aspect ratio comprising a ratio of said length of said through-wafer via to said width.

15. The method of claim 14, further comprising:
forming a dielectric layer on side walls and bottom walls of said through-wafer via trench, wherein said filling of said through-wafer via trench with said electrically conductive material is performed after said forming of said dielectric layer; and
after said removing of said material, forming a bottom pad structure on a ground surface of said through-wafer via such that said bottom pad structure is in direct physical contact with said through-wafer via.

16. The method of claim 14, wherein, in said forming step, said shape of said through-wafer via trench comprises said C-shape.

17. The method of claim 16, wherein, in said forming step, said C-shape comprises an annulus with a break, said annulus having a diameter and a fill gap, a ratio of said diameter to said fill gap being at least four.

18. The method of claim 14, wherein, in said forming step, said shape of said through-wafer via trench comprises interlocked first and second C-shapes.

19. The method of claim 18, wherein, in said forming step, said interlocked first and second C-shapes each comprise an annulus with a break, said annuli each having a diameter and a fill gap, a ratio of said diameter of each of said annuli to said fill gap being at least six.

20. The method of claim 14, wherein, in said forming step, said shape of said through-wafer via trench comprises said spiral.

21. The method of claim 14, wherein, in said forming step, said shape of said through-wafer via comprises said C-shape, said C-shape in turn comprising a three-quarter annulus of a first annulus diameter and a one-half annulus at a second annulus diameter about forty percent of said first annulus diameter.

22. The method of claim 21, wherein, in said forming step, said C-shape has a fill gap, a ratio of said first annulus diameter to said fill gap being at least ten.

23. The method of claim 14, wherein, in said forming step, said through-wafer via trench exhibits uniform curvature when viewed in a plane perpendicular to said first reference direction and parallel to said top wafer surface.

24. The method of claim 14, wherein, in said forming step, said through-wafer via and adjacent portions of said wafer exhibit cooperative topological connectivity.

25. A structure, comprising:
   a wafer having a top wafer surface, said wafer defining an opening, said top wafer surface defining a first reference direction perpendicular to said top wafer surface, said wafer having a thickness in said first reference direction; and
   a through-wafer via formed in said opening, said through-wafer via having a shape, when viewed in a plane perpendicular to said first reference direction and parallel to said top wafer surface, of at least one of a spiral and a C-shape, said through-wafer via having a height in said first reference direction essentially equal to said thickness of said wafer in said first reference direction, wherein said shape of said through-wafer via comprises interlocked first and second C-shapes.

26. A method comprising the steps of:
   providing a wafer having a top wafer surface, said top wafer surface defining a first reference direction perpendicular to said top wafer surface, said wafer having a thickness in said first reference direction; and
   forming a through-wafer via trench in said wafer, said through-wafer via trench having a shape, when viewed in a plane perpendicular to said first reference direction and parallel to said top wafer surface, of at least one of a spiral and a C-shape, said through-wafer via trench having a height in said first reference direction less than said thickness of said wafer in said first reference direction, wherein, in said forming step, said shape of said through-wafer via comprises said C-shape, said C-shape in turn comprising a three-quarter annulus of a first annulus diameter and a one-half annulus at a second annulus diameter about forty percent of said first annulus diameter.

* * * * *